United States Patent
Lee et al.

(10) Patent No.: US 7,749,779 B2
(45) Date of Patent: Jul. 6, 2010

(54) LANDING PAD FOR USE AS A CONTACT TO A CONDUCTIVE SPACER

(75) Inventors: Dana Lee, Santa Clara, CA (US); Wen-Juei Lu, Cupertino, CA (US); Felix Ying-Kit Tsui, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/266,443

(22) Filed: Nov. 6, 2008

(65) Prior Publication Data

US 2009/0061547 A1    Mar. 5, 2009

Related U.S. Application Data

(62) Division of application No. 11/221,161, filed on Sep. 6, 2005, now abandoned, which is a division of application No. 10/693,067, filed on Oct. 23, 2003, now Pat. No. 6,960,803.

(51) Int. Cl.
    *H01L 21/66* (2006.01)
(52) U.S. Cl. ........... 438/17; 438/18; 257/E21.522; 257/E21.523; 257/E21.526; 257/E21.53; 257/48
(58) Field of Classification Search .......... 438/17, 438/18; 257/E21.521, E21.522, E21.523, 257/E21.525, E21.526, E21.53, 48
See application file for complete search history.

(56) References Cited

U.S. PATENT DOCUMENTS

| 6,329,685 | B1 | 12/2001 | Lee |
| 6,514,828 | B2 | 2/2003 | Ahn et al. |
| 6,525,371 | B2 | 2/2003 | Johnson et al. |
| 6,759,712 | B2 | 7/2004 | Bhattacharyya |
| 6,815,760 | B2 | 11/2004 | Leung et al. |
| 6,909,300 | B2 * | 6/2005 | Lu et al. ................ 324/761 |
| 7,105,379 | B2 * | 9/2006 | Tsao et al. ............... 438/114 |
| 7,271,013 | B2 * | 9/2007 | Yong et al. ............... 438/14 |
| 7,279,707 | B2 * | 10/2007 | Chen et al. ............... 257/48 |
| 7,391,226 | B2 * | 6/2008 | Michael et al. .......... 324/713 |
| 2004/0203211 | A1 | 10/2004 | Yang et al. |
| 2005/0054167 | A1 | 3/2005 | Choi et al. |
| 2007/0259431 | A1 * | 11/2007 | Charlton et al. ........... 436/2 |
| 2009/0162954 | A1 * | 6/2009 | Griffin et al. ............ 438/18 |
| 2009/0289253 | A1 * | 11/2009 | Pendse ................... 257/48 |

* cited by examiner

*Primary Examiner*—Mary Wilczewski
(74) *Attorney, Agent, or Firm*—DLA Piper LLP (US)

(57) ABSTRACT

A landing pad for use as a contact to a conductive spacer adjacent a structure in a semiconductor device comprises two islands, each of which is substantially rectangularly shaped and is spaced apart from one another and from the structure. Conductive spacers are adjacent to each island and overlapping each other and overlapping with the conductive spacer adjacent to the structure. The contact to the landing pad is on the conductive spacers adjacent to the islands and spaced apart from the structure.

5 Claims, 5 Drawing Sheets

LANDING PAD FOR USE AS A CONTACT TO A CONDUCTIVE SPACER

CROSS REFERENCE TO RELATED APPLICATIONS

This application is a divisional of U.S. application Ser. No. 11/221,161, filed Sep. 6, 2005, which is a divisional of U.S. application Ser. No. 10/693,067, filed on Oct. 23, 2003, now U.S. Pat. No. 6,960,803, the entire contents of both are incorporated herein by reference.

TECHNICAL FIELD

The present invention relates to a landing pad for use as a contact to a conductive polysilicon and more particularly wherein the conductive polysilicon is shaped as a spacer adjacent a structure in a semiconductor device.

BACKGROUND OF THE INVENTION

Landing pads are well known in the art. They are used in a semiconductor device to provide electrical contact from one conductive layer, typically a metal layer to a conductive polysilicon layer through an insulating layer. Typically, conductive polysilicon is used in the formation of a logic or memory circuit, and the metal layer is used to carry signal and/or power to or from the circuit.

Referring to U.S. Pat. No. 6,329,685, whose disclosure is incorporated herein in its entirety, there is shown a non-volatile memory cell with a control gate made of conductive polysilicon in the shaped of a spacer. See FIG. 2H-4 thereof. This is also shown as FIG. 1 hereof. The memory cell 10 comprises a semiconductor substrate 11, of a first conductivity type, typically P type. The cell 10 comprises a first insulating layer 12 on the substrate 11. A floating gate 14, having a tip that permits Fowler-Nordheim tunneling of charges from the floating gate 14 to the control gate 40, is also made from conductive polysilicon and is formed on the first insulating layer 12. The floating gate 14 is also capacitively coupled to a region 30 in the substrate 11. A source contact 34, also typically made from a conductive polysilicon, electrically connects to the region 30 in the substrate 11. The source contact 34 is also insulated from the floating gate 14 by a second insulating layer 26. The structure 20 comprising the floating gate(s) 14, the first insulating layer 12, the source contact 34 and the second insulating layer 26 is generally rectangularly shaped, and has a substantially planar surface against which the control gate 40 in the shape of a spacer is formed. The spacer shaped control gate 40 is made of conductive polysilicon. As is well known, to form a spacer, polysilicon is conformally deposited on the structure 20. The polysilicon is then subject to an anisotropic etch which results in the spacer shape. The spacer shaped control gate 40 can be made conductive by, for example, ion implantation, either before the polysilicon is etched, or after the polysilicon is etched, i.e. after it is shaped into a spacer shape.

Referring to FIG. 2 there is shown a top view of the structure shown in FIG. 1. Generally, the structures 20 are fabricated as parallel strips, parallel to one another, with the control gate spacers 40, immediately adjacent to the structure 20, and therefore also parallel to one another.

The structure shown in FIG. 1 is further fabricated to form additional regions in the substrate 11, each of which is spaced apart from an associated region 30, and is between a pair of adjacent spacer control gates 40. Thereafter, insulating material (not shown), such as BPSG or any other form of glass or oxide material is deposited. Finally, landing pads are formed through the insulating material to contact the spacer shaped control gate 40. A landing pad, such as 50 shown in FIG. 2 is a hole or via, made in the insulating material that covers the structure shown in FIG. 1, so that a metal contact to the conductive polysilicon control gate 40 can be made. Although the formation of landing pads is well known, the formation of a landing pad to a spacer shaped conductive material, and in particular one that is used as a control gate creates a special problem.

Referring to FIG. 2, there is shown a landing pad 50 that is located to make electrical contact with the control gate 40. The formation of a landing pad 50 to a memory array in which rows of control gates 40 are formed parallel and spaced apart from one another means that the landing pad 50 must be accurately positioned in the X direction. If there is any significant deviation in the X direction, the landing pad 50 might make contact with the "wrong" row of control gate, i.e. 40c instead of 40b. Alternatively, the landing pad 50 might contact the source contact 34. Furthermore, the problem of making a landing pad 50 contacting a spacer conductor 40 is further exacerbated by the shape of the conductor 40. Thus, even if the landing pad 50 is positioned within the range of tolerance, i.e. it does not contact the control gate 40c nor make contact with the source contact 34, because the spacer control gate 40 is curvlinearly shaped, the depth of the landing pad 50 required to make contact may differ significantly from one landing pad to another, leading to potential poor electrical contact.

Hence there is a need to develop a landing pad which can be used to make electrical contact with a spacer shaped conductive member.

SUMMARY OF THE INVENTION

A landing pad for use as a contact to a conductive spacer adjacent a structure in a semiconductor device comprises two islands, each of which is substantially rectangularly shaped and is spaced apart from one another and from the structure. Conductive spacers are adjacent to each island and overlapping each other and overlapping with the conductive spacer adjacent to the structure. The contact to the landing pad is on the conductive spacers adjacent to the islands and spaced apart from the structure.

BRIEF DESCRIPTION OF THE DRAWINGS

FIG. 7b is a top view of the device shown in FIG. 7a.

FIG. 7c is a cross sectional view of a method of the prior art to test the potential defects in the manufacturing of the row of studs shown in FIG. 7a.

DETAILED DESCRIPTION OF THE INVENTION

Figure 1:
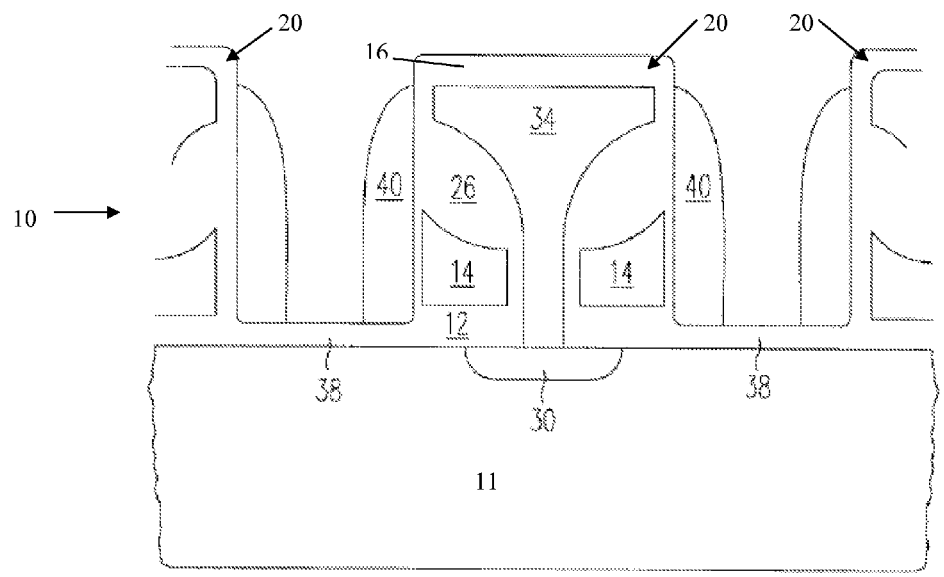
FIG. 1 is a cross section view of a non-volatile memory array semiconductor device having a conductive spacer to which the landing pad of the present invention may be used.
Figure 2:
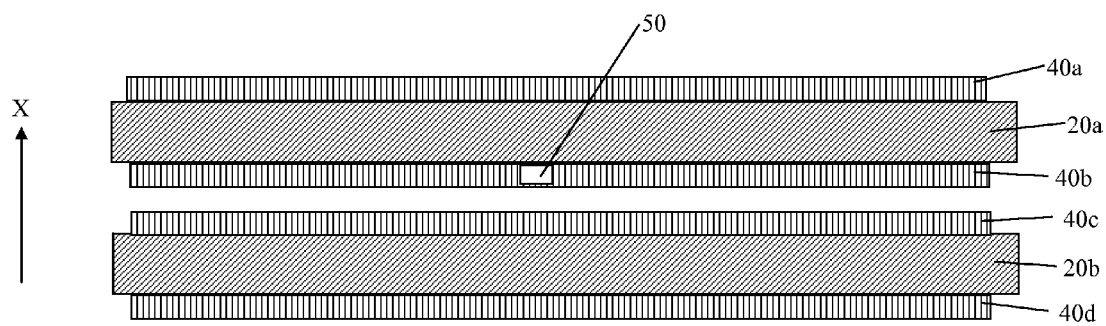
FIG. 2 is a top view of the device shown in FIG. 1.
Figure 3:
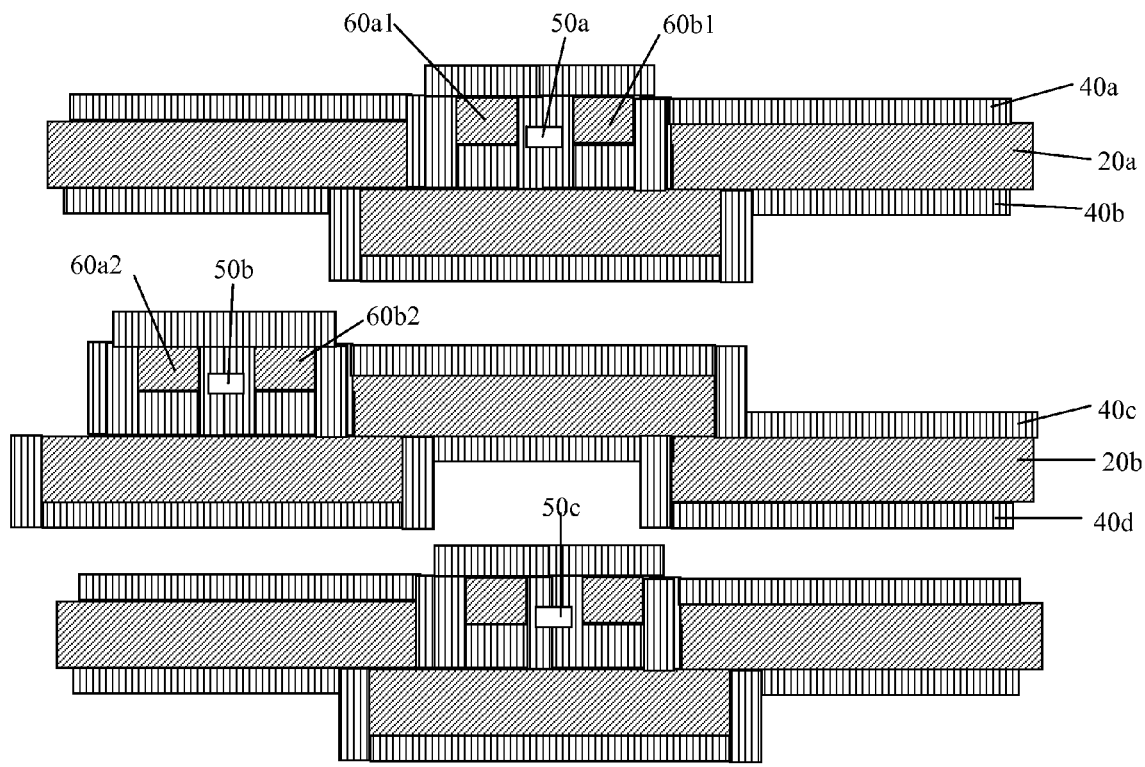
FIG. 3 is a top view of the landing pad of the present invention used in a memory cell array of the present invention.

Referring to FIG. 3 there is shown a top view of a landing pad 50 of the present invention used with a spacer shaped control gate 40 in a non-volatile memory array device. As shown and discussed in FIG. 1, the spacer shaped control gates 40 are formed adjacent to a structure which has a planar surface, adjacent to the control gate 40. However, in a preferred embodiment, unlike the structures shown in FIG. 2, the structures 20 shown in FIG. 3 are not linear and evenly spaced apart from one another. In particular, the distance of separation (measured as a perpendicular line from one structure 20 to an adjacent structure 20) varies. Where a landing pad 50 is located between two adjacent structures 20, the distance of separation between those two structures 20 is greater than the distance of separation between the two structures 20 at locations other than where the landing pad 50 is located. Similarly, of course, the control gates 40 which are immediately adjacent to the structures 20 are also not linear and evenly spaced apart from one another. The structures 20 (and the associated control gate spacers 40) generally run in a row direction (although the term row and column may be interchanged). Although FIG. 3 shows the structures 40 and the associated control gate spacers 40 as being not linear and evenly spaced, it is not necessary for the practice of the present invention that the control gates 40 be not evenly spaced and not linear. In fact, the present invention is not limited to the use of a landing pad 50 in a semiconductor memory device. The landing pad 50 of the present invention may be used with any spacer shaped conductive polysilicon.

The landing pad 50 comprises two islands 60a and 60b, each substantially rectangularly shaped, and spaced apart from one another and from the structure 20 which has the associated control gate spacer 40 to which the landing pad 50 is intended to make contact. Thus, as shown in FIG. 3, the landing pad 50a is intended to make electrical contact with control gate 40a which is adjacent to the structure 20a. The landing pad 50a comprises a first island 60a1 and a second island 60b1, each separated from one another, and separated from the structure 20a (which is the definition of an "island").

Surrounding each island 60a and 60b are electrically conductive spacers, which overlap with one another and overlap with the control gate spacer 40. Thus, the islands 60a and 60b must be spaced apart from one another and from the structure 20, such that the spacers that are formed about the islands 60a and 60b and the spacer 40 will overlap. This means that the islands 60a and 60b are spaced apart from one another by a distance which is less than twice the width of each conductive spacer, and from the structure 20 by a distance which is less than twice the width of the conductive spacer 40. The landing pad hole 50 that is formed to contact the control gate spacer 40 is then made at a location which is between the islands 60a and 60b and between the islands 60a and 60b and the structure 20. Because the conductive spacers that are formed around each of the islands overlap with one another and with the control gate spacer 40, the landing pad hole 50 can be positioned with more tolerance than heretofore. Further, as will be seen hereinafter, because the spacers overlap, the area where the landing pad hole 50 is formed will contact the overlapping spacers at a region where the spacers do not exhibit sharp curvilinear dimensions, thus providing for greater electrical contact in all of the landing hole contacts.

Referring to FIGS. 5(a-c) and 6(a-c) there is shown one method for making the landing pad 50 of the present invention in the memory array 10 of the prior art, to form the memory array of the present invention, shown in FIG. 3. In the first step, oxide layer 12 is deposited on the substrate 11. The oxide 12 is the same layer of oxide that is used in the structure 20. Thus, the formation of the oxide layer 12, outside of the structure 20 would not be an extra processing step.

A first layer of polysilicon 14 is then deposited on the oxide layer 12. The first polysilicon 14 is also the polysilicon that is used to form the floating gate 14 in the structure 20. Thus, again this step would not be an extra processing step.

The polysilicon 14 is then mask and etched, forming the floating gate 14, and the islands 60. Since a masking step is otherwise need to form the floating gates 14, this again would not necessitate an extra processing step. The only change is the pattern of the mask to accommodate the formation of the islands 60, as well as the non-linearity of the floating gate 14 as shown in FIG. 3.

Oxide 16 is then deposited over the structure. This would be the same oxide that is used in the formation of the structure 20 to cover the source contact 34. Thus, again the deposition of the oxide 16 to cover the polysilicon island 60 would not necessitate an extra processing step.

Figure 5A:
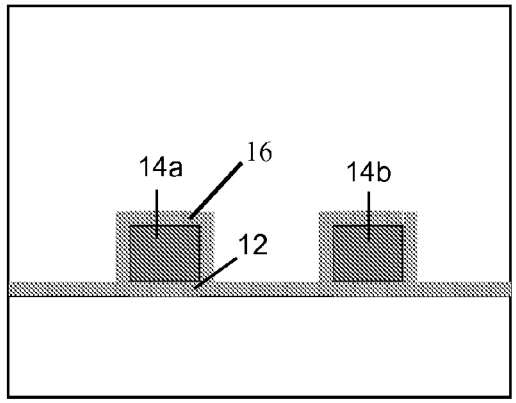
FIGS. 5a-c are cross sectional views of the structure shown in FIG. 4 taken along the lines 5-5, showing a method of forming the landing pad of the present invention.
Figure 6A:
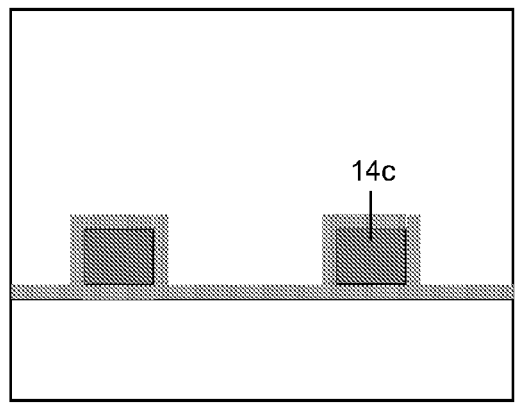
FIGS. 6a-c are cross sectional views of the structure shown in FIG. 4 taken along the lines 6-6, showing a method of forming the landing pad of the present invention.

Polysilicon 40 is then deposited over the structure shown in FIGS. 5a and 6a. The polysilicon 40 is conformally deposited as it would be during the formation of the control gate spacers 40. Thus, this would not necessitate an extra processing step. The resultant structure is shown in FIGS. 5b and 6b.

Figure 5B:
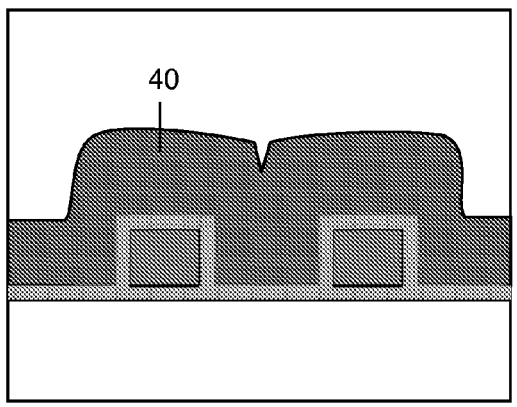
Figure 6B:
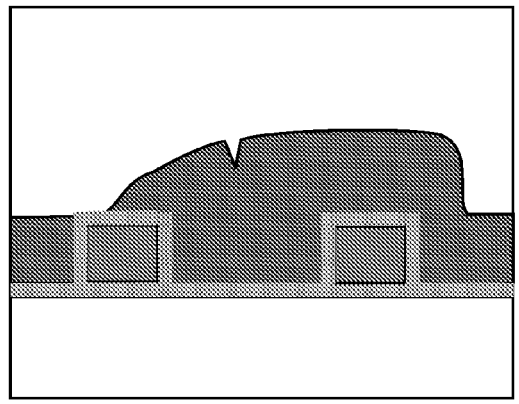

The structure shown in FIGS. 5b and 6b is anisotropically etched. This etching step is the same process used to etch the polysilicon 40 in the formation of the control gate spacer 40. Thus, this would not necessitate an extra processing step. The etching step causes the formation of spacers surrounding each of the islands 60. However, because the islands are spaced apart less than twice the width of the resultant spacers, the spacers 40 that surround each of the islands 60 would overlap, and also over lap with the control gate spacers 40.

Thereafter, the entire structure is covered with a dielectric material 42, such as BPSG or any other well known dielectric used in semiconductor processing. The dielectric 42 would be the same dielectric that would normally be used in the formation of the prior art memory cell array 10, to cover the control gate spacer 40. Thus, this would not necessitate an extra processing step.

A masking step is then used to form contact holes 50 in the dielectric 42. This would be the same masking step that is normally used to form the contact holes 50, as is done in the prior art. Thus, no additional processing step is required. However, because the contact hole 50 will contact the polysilicon 40 in a regions where the spacers overlap, and where there is less slope, the depth of the contact hole 50 is more reliable in contacting the spacer 40 than in the prior art.

Figure 4:
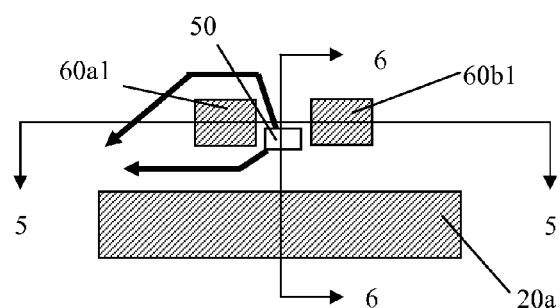
FIG. 4 is a top view of a portion of the structure shown in FIG. 3, without the conductive spacers.
Figure 5C:
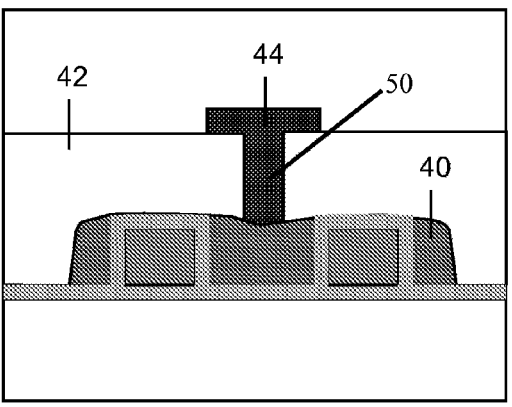
Figure 6C:
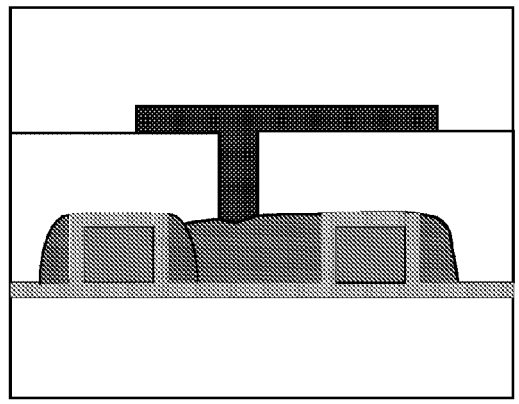

Metal layer 44 is then deposited on the dielectric 42, and in the contact hole 50. The metal layer 44 is then masked. Again, this would be the same processing step as is done in the prior art, and thus no additional processing step is required. The resultant structure is shown in FIGS. 5c and 6c. As can be seen from the foregoing, with the landing pad 50 of the present invention, greater electrical contact reliability can be achieved, and in one embodiment without requiring any additional processing step. Further, not only is there increased reliability in not contacting undesired structures, but also reliability in the depth of contact to the spacer 40, but there is also an increase in electrical reliability in electrical current flow in the lateral direction. Referring to FIG. 4, which is a top view of a landing pad of the present invention, as can be seen from FIG. 4, current can flow from the landing pad 50 in two directions, around the island 60. Thus, there is increased electrical reliability current flow in the lateral direction as well. The spacing between the islands 60 and between the islands 60 and the structure 20 can be as small as the lithographic dimensions or as large as two times the width of the spacer 40 that surrounds the islands 60 and the control gate spacer 40.

Figure 7A:
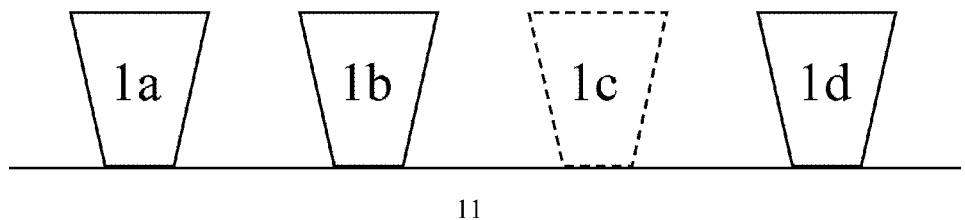
FIG. 7a is a cross sectional view of a row of studs in a semiconductor device of the prior art to which another aspect of the present invention may be used to test potential defects in the manufacturing of the row of studs.
Figure 7B:
Figure 7C:
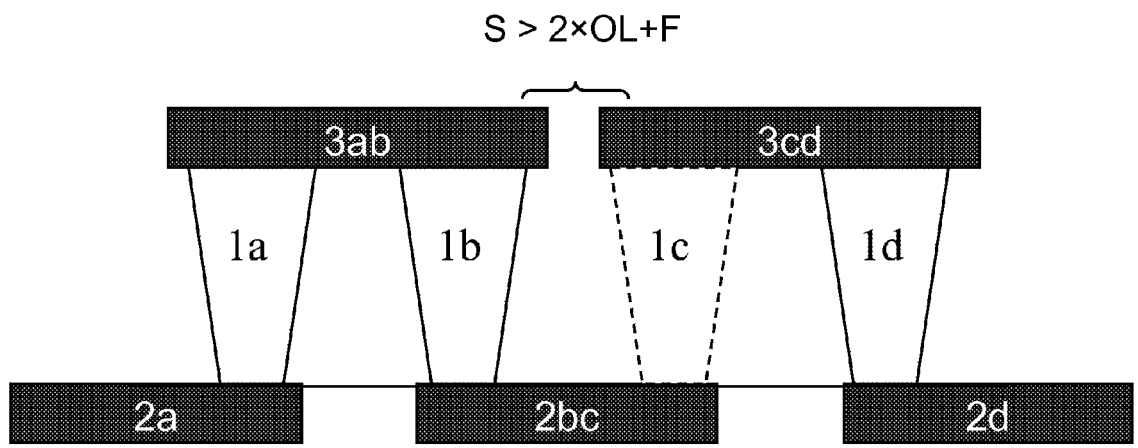
Figure 8A:
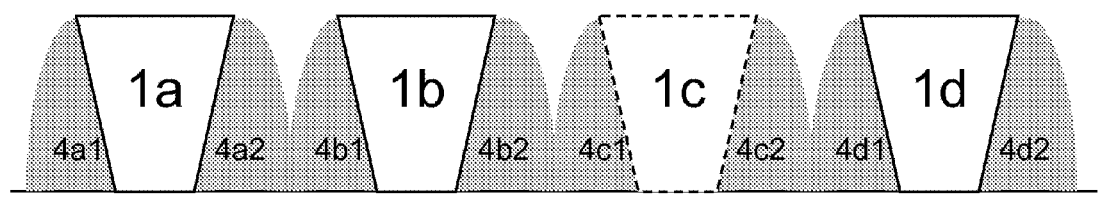
FIG. 8a is a cross sectional view of a row of studs in a semiconductor device tested in accordance with the method of the present invention.
Figure 8B:
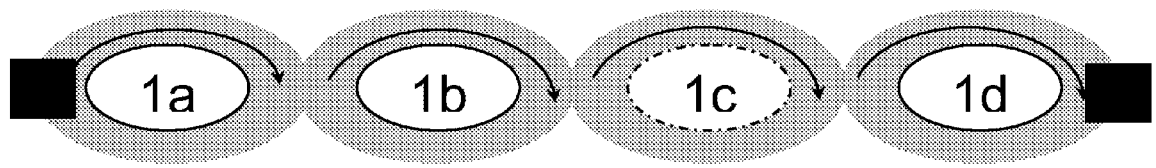
FIG. 8b is a top view of the row of studs shown in FIG. 8a and tested with the method of the present invention.

Referring to FIG. 7 there is shown a structure to which another aspect of the present invention can be used. In FIG. 7 there is shown a row of spaced apart electrically conductive studs 1(a-d) on a substrate 11. Typically, the studs 1 can be found as the resistive elements in a cross-point memory array. Another aspect of the present invention is to test the process architecture in the formation of the plurality of studs 1. Thus, the present invention can be used to determine if the studs are formed, and if so, whether they are of the "correct" dimensions. For example, stud 1c is shown as being possibly defective, being either of the incorrect lateral dimensions or non-existent. Of course, one would not know before hand that stud 1c is defective. Stud 1c is shown as for illustration purpose only.

In the prior art, to determine if all the studs 1(a-d) have been made correctly, i.e. the process flow would produce the studs 1(a-d), diffusion regions 2a, 2bc, and 2d are formed in the eh substrate 11, connecting studs 1a, 1b to 1c, and 1d respectively. Further, polysilicon connections 3ab and 3cd are made connecting the top of the studs 1a to 1b, and 1c to d, respectively. The polysilicon connections 3ab and 3cd are separated by a distance S>2×OL+F, where OL is the overlap (between elements 3ab and 1b or between 3cd and 1c) and F is a feature size spacing between the conductors 3ab and 3cd. A continuity test is then performed between diffusion regions 2a and 2d. In the event one of the studs is defective (i.e. the stud is non-existent or it is dimensionally too narrow), there would not be any current flow between diffusion regions 2a and 2d.

In another method of the present invention, electrically conductive spacers 4 are formed about each of the studs 1(a-d). The width of the spacer W is chosen to be ½ of the spacing between each stud 1(a-d) that is to be checked. The spacer width W is not lithographically limited; thus, the spacing can be arbitrarily close. Once the spacers 4 are formed around each stud 1, an electrical continuity test is performed between spacers 4a1 and 4d2, which lie at the ends of the row of studs 1(a-d). If there is continuity, then the studs 1(a-d) are formed. If there is no continuity, i.e. if the stud 1c is missing, then there would not be any spacer formed surrounding the stud 1c, thereby breaking the continuity. Finally, if a stud is too small or too narrow, then again the continuity will be broken.

The method of the present invention to test the process to determine the formation of a row of spaced apart studs 1(a-d) can also be made to test a row of spaced apart holes. To test the holes, each hole is first converted to a stud by the use of the well known damascene process, in which material (such as polysilicon or dielectric) is deposited into the holes to fill the holes, and the surrounding material is then etched away leaving a plurality of spaced apart studs. The converted studs can then be tested in the manner previously described.

As can be seen from the foregoing, with the present invention, the reliability of an electrical contact between a conductive layer, such as metal to an underlying conductive spacer, through a dielectric is increased. In addition, with the present invention, the formation of a plurality of spaced apart studs, or holes (which are first converted to studs), can be electrically tested.

What is claimed is:

1. A method of detecting one or more defects in a string of spaced apart studs on a semiconductor substrate wherein each stud is separated by a distance of 2X from an adjacent stud, said method comprising:
    forming a plurality of conductive spacers with each spacer formed adjacent each stud, and overlapping with an adjacent spacer, each spacer having a width of at least X; and
    electrically testing the continuity of the plurality of conductive spacers;
    wherein in the event of failure of the testing step, said failure is indicative of the existence of one or more defects.

2. The method of claim 1 wherein said step of forming a plurality of conductive spacers comprises:
    depositing conformally a layer of conductive polysilicon over said string of studs;
    anisotropically etching said layer of conductive polysilicon to form said plurality of conductive spacers.

3. A method of detecting one or more defects in a string of spaced apart holes in a semiconductor device wherein each hole is separated by a distance of 2X from an adjacent hole, said method comprising:
    converting each hole into a stud;
    forming a plurality of conductive spacers with each spacer formed adjacent each stud, and overlapping with an adjacent spacer, each spacer having a width of at least X; and
    electrically testing the continuity of the plurality of conductive spacers;
    wherein in the event of failure of the testing step, said failure is indicative of the existence of one or more defects.

4. The method of claim 3 wherein said step of forming a plurality of conductive spacers comprises:
    depositing conformally a layer of conductive polysilicon over said string of studs;
    anisotropically etching said layer of conductive polysilicon to form said plurality of conductive spacers.

5. The method of claim 3 wherein said converting step comprises a damascene process.

* * * * *